United States Patent
Kim

(10) Patent No.: US 9,988,719 B2
(45) Date of Patent: Jun. 5, 2018

(54) METHOD OF MANUFACTURING AN ELECTRODE FOR VAPOR DEPOSITION

(75) Inventor: Jae Bum Kim, Suwon (KR)

(73) Assignee: Dae San Materials Co., Ltd., Seoul (KR)

(*) Notice: Subject to any disclaimer, the term of this patent is extended or adjusted under 35 U.S.C. 154(b) by 304 days.

(21) Appl. No.: 14/350,428

(22) PCT Filed: Mar. 28, 2012

(86) PCT No.: PCT/KR2012/002237
§ 371 (c)(1),
(2), (4) Date: Apr. 8, 2014

(87) PCT Pub. No.: WO2013/058449
PCT Pub. Date: Apr. 25, 2013

(65) Prior Publication Data
US 2014/0242410 A1     Aug. 28, 2014

(30) Foreign Application Priority Data
Oct. 19, 2011  (KR) .................... 10-2011-0107152

(51) Int. Cl.
*H01R 43/00* (2006.01)
*C23C 16/50* (2006.01)
(Continued)

(52) U.S. Cl.
CPC ............ *C23C 16/50* (2013.01); *B32B 15/043* (2013.01); *C01B 33/035* (2013.01);
(Continued)

(58) Field of Classification Search
CPC ..... C01B 33/035; C23C 16/50; B32B 15/043; Y10T 428/12493; Y10T 29/49208; Y02P 70/521; Y02E 10/546
(Continued)

(56) References Cited

U.S. PATENT DOCUMENTS 6,177,647 B1 * 1/2001 Zapletal .................. H05H 1/34
219/121.52
7,073,256 B2 * 7/2006 Muranaka ............... H01T 21/02
29/508
(Continued)

FOREIGN PATENT DOCUMENTS

CN    101919028 A    12/2010
CN    102047750 A    5/2011
(Continued)

OTHER PUBLICATIONS

International Search Report for PCT/KR2012/002237 dated Oct. 16, 2012.

*Primary Examiner* — Peter DungBa Vo
*Assistant Examiner* — Azm Parvez
(74) *Attorney, Agent, or Firm* — Dinsmore & Shohl LLP

(57) ABSTRACT

An electrode for vapor deposition process may include: a body section mounted at a lower portion of the electrode and adapted to be electrically connected to an external electric source; and a head section integrally formed at an upper portion of the body section and coupled to a substrate, wherein the body section and the head section are formed through forging. According to the electrode, manufacturing cost is greatly lowered and electric conductivity and heat resistance are improved.

9 Claims, 11 Drawing Sheets

(51) Int. Cl.
*C01B 33/035* (2006.01)
*B32B 15/04* (2006.01)
*H01L 31/18* (2006.01)

(52) U.S. Cl.
CPC .......... *H01L 31/182* (2013.01); *Y02E 10/546* (2013.01); *Y02P 70/521* (2015.11); *Y10T 29/49208* (2015.01); *Y10T 428/12493* (2015.01)

(58) Field of Classification Search
USPC ............... 29/876, 874, 825, 592.1; 428/615; 228/173.1; 427/125
See application file for complete search history.

(56) References Cited

U.S. PATENT DOCUMENTS

| | | | | |
|---|---|---|---|---|
| 2010/0034985 | A1* | 2/2010 | Krueger | A61L 2/14 427/579 |
| 2010/0122657 | A1* | 5/2010 | Hsieh | C01B 33/035 118/723 E |
| 2011/0031115 | A1* | 2/2011 | Hillabrand | C23C 16/4418 204/286.1 |

FOREIGN PATENT DOCUMENTS

| | | |
|---|---|---|
| KR | 100921210 B1 | 10/2009 |
| KR | 20110008082 U | 8/2011 |
| RU | 2187416 C1 * | 8/2002 |

* cited by examiner (a)

30'

(b)

30'

(a)

(b)

(a)

(b)　　　　　　　　(c)

METHOD OF MANUFACTURING AN ELECTRODE FOR VAPOR DEPOSITION

CROSS-REFERENCE TO RELATED APPLICATIONS

This application is the U.S. National Phase of PCT/KR2012/002237 filed Mar. 28, 2012, which claims priority of Korean Patent Application 10-2011-0107152 filed Oct. 19, 2011.

BACKGROUND OF THE INVENTION (a) Field of the Invention

The present invention relates to an electrode for vapor deposition process and a manufacturing method thereof. More particularly, the present invention relates to an electrode for vapor deposition process that is used to vapor-deposit polysilicon for manufacturing a solar cell and a manufacturing method thereof.

(b) Description of the Related Art

Solar cells are divided into crystalline type and thin film type depending on raw material and technology. Generally, manufacturing cost of solar cells of crystalline type is higher than that of solar cells of thin film type, but the solar cells of crystalline type has higher photovoltaic property than the solar cells of thin film type. Therefore, the solar cells of crystalline type make up majority of the solar cell market. The solar cells of crystalline type use polysilicon as raw material.

Siemens Method is well known as a manufacturing method of the polysilicon. As shown in FIG. 1, a silicon filament is disposed in a reactor and is heated by electricity, and TCS gas is supplied to the reactor according to the Siemens Method. If MG-Si (95-99.5% purity) obtained by removing $O_2$ and impurities from silicon that exists as $SiO_2$ in nature is reacted with HCL, various gases containing TCS are generated. After that, TCS gas is separated through distillation from the various gases.

If TCS gas is supplied into the reactor, silicon molecules is deposited on a surface of the silicon filament heated to high temperature. Through these processes, silicon filament becomes thicker and is developed to a silicon rod.

If the silicon rod is broken into a suitable size, bulk polysilicon that can be used for manufacturing the solar cell is finally obtained.

When manufacturing the polysilicon, at least one electrode is mounted at a lower portion of the silicon filament so as to apply electricity in the reactor. Such an electrode endures high temperature environment so as to maintain electrically conducting state. Since the electrode is manufactured by cutting a pillar to have a predetermined shape and digging the pillar so as to form a coolant passage according to conventional arts, mass production may not be suitable and manufacturing cost may increase due to increasing use of raw material.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide an electrode for vapor deposition process and a manufacturing method thereof having advantages of lowering manufacturing cost of an electrode used for manufacturing polysilicon that is a raw material of solar cells and supplying electric power stably and reliably under a high temperature environment.

An electrode for vapor deposition process according to an exemplary embodiment of the present invention may include: a body section mounted at a lower portion of the electrode and adapted to be electrically connected to an external electric source; and a head section integrally formed at an upper portion of the body section and coupled to a substrate, wherein the body section and the head section are formed through forging.

A lower interior circumference of the body section may be removed by a predetermined depth so as to form a coolant passage.

The head section may have '⊥' shape where an upper portion is narrower than a lower portion, and the lower portion of the head section may have a larger diameter than the body section.

The head section and the body section may have external circumferential surfaces formed with silver plating layers.

An insulation layer may be formed at an external circumferential surface of the silver plating layer of the body section.

Material of the head section and the body section may be oxygen-free copper, oxygen-free high-conductivity copper (OFHC), or tough pitch copper.

The electrode may further include a nut section coupled to the lower portion of the body section, electrically connected to the external electric source, and formed through forging.

A coolant supplying line may be formed at a side portion of the nut section and be connected to the coolant passage of the body section.

The nut section may further include a connecting section extending downwardly from the nut section so as to be coupled with the external electric source, and the external electric source may be coupled to one side or both sides of the connecting section.

A method of manufacturing an electrode for vapor deposition process according to another exemplary embodiment of the present invention may include: preparing a pillar for manufacturing the electrode; disposing the pillar in a die having a shape corresponding to that of the electrode; and forming a head section and a body section of the electrode by forging the pillar by means of the die.

The die may be adapted to form a coolant passage by removing a part of a lower surface of the body section by a predetermined depth.

The head section may have '⊥' shape where an upper portion is narrower than a lower portion, and the lower portion of the head section has a larger diameter than the body section.

The method may further include plating silver on external circumferential surfaces of the head section and the body section.

The method may further include plating an insulation layer on an external circumferential surface of the body section plated by the silver.

The pillar may be made of oxygen-free copper, oxygen-free high-conductivity copper (OFHC), or tough pitch copper.

A method of manufacturing an electrode for vapor deposition process according to other exemplary embodiment of the present invention may include: integrally forming a head section adapted to be coupled to a substrate and a body section provided with a coolant passage through forging;

and forming a nut section coupled to a lower portion of the body section and electrically connected to an external electric source through forging.

The method may further include: forming a coolant supplying line connected to the coolant passage and passing the coolant at the nut section; and coupling the body section with the head section through welding.

The nut section may further include a connecting section extending downwardly from the nut section so as to be coupled with the external electric source, and the external electric source is coupled to one side or both sides of the connecting section.

<Description of symbols>

| | |
|---|---|
| 10: reactor | 11: base plate |
| 20: substrate (silicon filament) | 30: electrode |
| 30': pillar of electrode | 31: head section |
| 32: body section | 33: coolant passage |
| 34: silver plating layer | 35: insulation layer |
| 36: nut section | |

DETAILED DESCRIPTION OF THE EMBODIMENTS

Exemplary embodiments of the present invention will hereinafter be described in detail with reference to the accompanying drawings.

Figure 2:
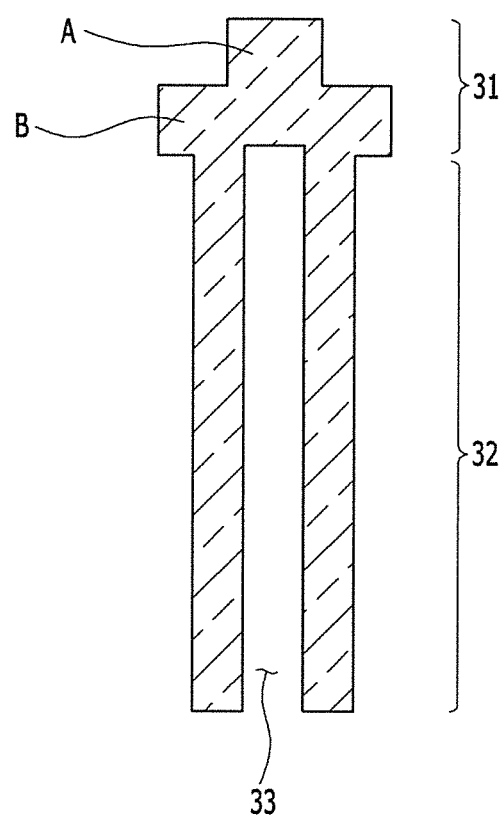
FIG. 2 is a cross-sectional view of an electrode for vapor deposition process according to an exemplary embodiment of the present invention.
Figure 3:
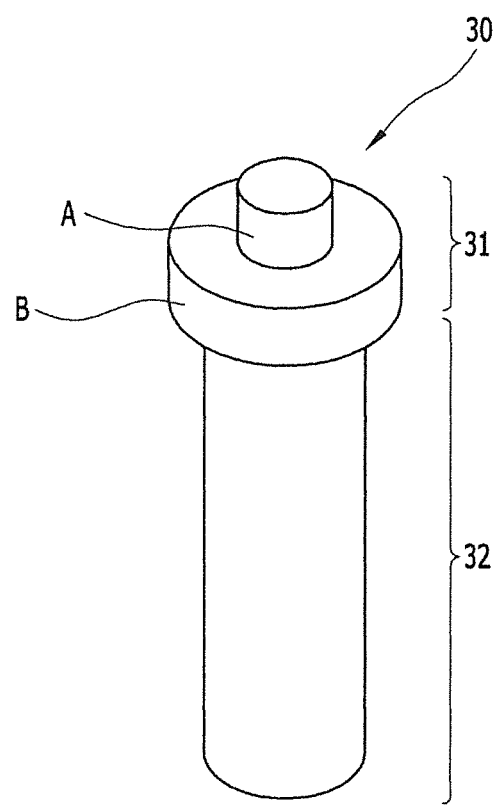
FIG. 3 is a perspective view of an electrode for vapor deposition process according to an exemplary embodiment of the present invention.

FIG. 2 is a cross-sectional view of an electrode for vapor deposition process according to an exemplary embodiment of the present invention, and FIG. 3 is a perspective view of an electrode for vapor deposition process according to an exemplary embodiment of the present invention.

As shown in FIG. 2 and FIG. 3, an electrode 30 for vapor deposition process according to an exemplary embodiment of the present invention includes a body section 32 adapted to support a lower portion of the electrode 30 and to electrically connected to an external electric source, and a head section 31 integrally formed at an upper portion of the body section 32 and coupled to a substrate 20.

Figure 1:
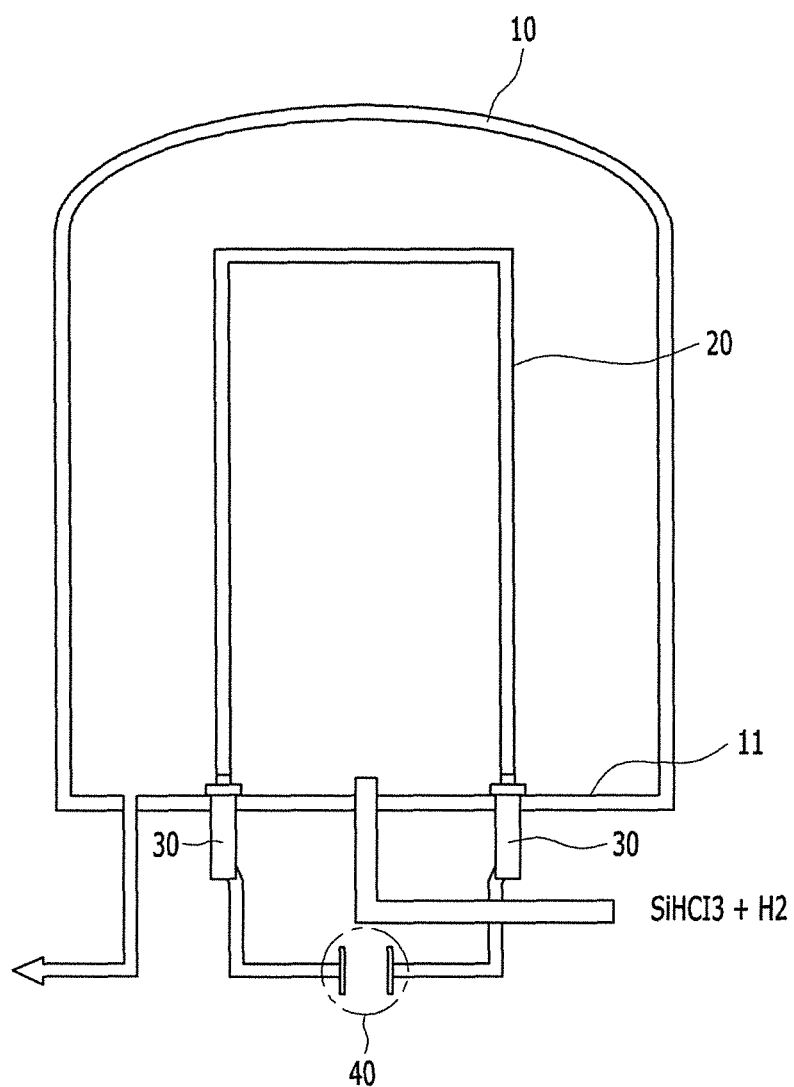
FIG. 1 is a cross-sectional view of a reactor to which an electrode for vapor deposition process according to an exemplary embodiment of the present invention is applied.

FIG. 1 is a cross-sectional view of a reactor 10 to which an electrode 30 for vapor deposition process according to an exemplary embodiment of the present invention is applied.

As shown in FIG. 1, the electrode 30 for vapor deposition process according to an exemplary embodiment of the present invention is mounted on a base plate 11 at a lower portion of the reactor 10. The substrate 20 such as a silicon filament is disposed on an upper portion of the electrode 30, receives electricity, and is heated. If TCS gas is supplied into the reactor 10 at a high temperature higher than or equal to 1000° C., silicon molecules are deposited on a surface of the silicon filament 20 heated to the high temperature. Through these processes, the silicon filament 20 becomes thicker and is developed to a silicon rod.

The body section 32 is formed at the lower portion of the electrode 30 and is electrically connected to the external electric source 40 so as to apply electricity to the silicon filament 20 through the head section.

In one or more exemplary embodiments, the body section 32, as shown in FIG. 1, is adapted to penetrate a lower surface of the base plate 11 of the reactor 10 and to be exposed from the reactor 10. Because a temperature in the reactor 10 is higher than or equal to 1000° C. for depositing the silicon molecules and the gas exists in the reactor 10, it is very difficult to safely connect the body section 32 in the reactor 10 with the external electric source 40 under such high temperature environment. Therefore, a part of or all of the body section 32 is exposed to the outside of the reactor 10 and the external electric source 40 is electrically connected to a part of the body section 32 which is exposed under the base plate 11 of the reactor 10 in one or more exemplary embodiments.

A lower interior circumference of the body section 32, as shown in FIG. 2, is removed by a predetermined depth so as to form a coolant passage 33. Coolant supplied from an external coolant supplying pipe flows through the passage 33 so as to lower temperatures of the body section 32 and the head section 31. Therefore, the passage 33 is formed to be extended to a lower surfaced of the head section 31 in one or more exemplary embodiments.

The head section 31 is integrally formed at the upper portion of the body section 32 and is connected to the substrate 20 such as the silicon filament 20 so as to apply electricity of the external electric source 40 to the substrate 20.

The head section 31, as shown in FIG. 2 and FIG. 3, has '⊥' shape where an upper portion A is narrower than a lower portion B, and the lower portion B of the head section 31 has a larger diameter than the body section 32.

As shown in FIG. 1, the body section 32 penetrates the base plate 11 of the reactor 10 and the head section 31 is supported by an upper surface of the base plate 11. Since the lower portion B of the head section 31 has the larger diameter than the body section 32, the head section 31 cannot penetrate the base plate 11 and is disposed on the upper surface of the base plate 11. Therefore, the electrode 30 is stably supported.

Since the head section 31 has '⊥' shape where the upper portion A is narrower than the lower portion B, use of raw material for manufacturing the electrode 30 may be reduced and manufacturing cost may be lowered.

In one or more exemplary embodiments, if the substrate 20 such as the silicon filament 20 can be stably connected to the upper portion A, a size of the upper portion A is not limited in head section 31 of the '⊥' shape.

Meanwhile, the head section 31 and the body section 32 are formed integrally through forging according to an exemplary embodiment of the present invention.

According to forging, a shape of a product is formed at room temperature by using a die and properties of material are improved. Since the product made through forging is not required to be cut, forging is economic mechanical working.

If the electrode 30 including the head section 31 and the body section 32 is formed integrally through forging in an exemplary embodiment of the present invention, manufacturing cost may be lowered.

Figure 4:
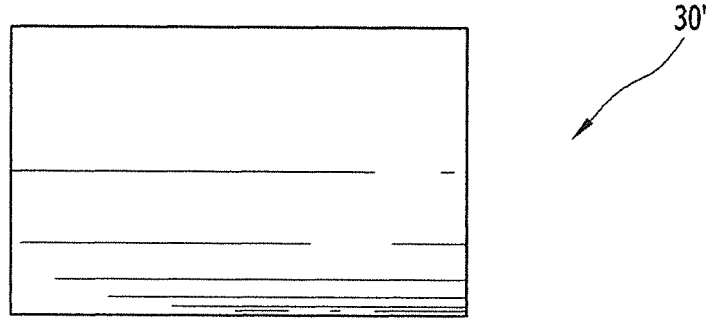
FIG. 4 is a schematic diagram of a pillar used for manufacturing an electrode for vapor deposition process according to an exemplary embodiment of the present invention.
Figure 4:
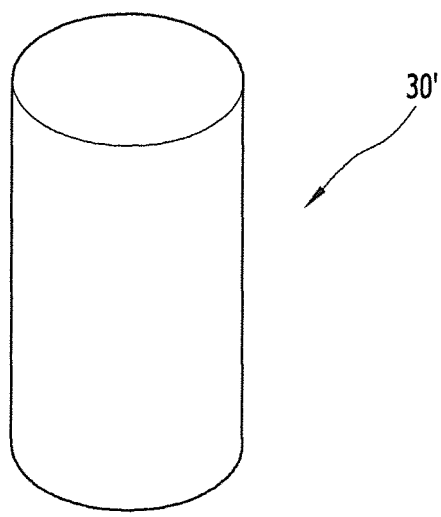

FIGS. 4(*a*) and 4(*b*) are schematic diagrams of a pillar 30' used for manufacturing an electrode for vapor deposition process according to an exemplary embodiment of the present invention.

The die having a shape corresponding to the head section 31 and the body section 32 is prepared, and a pillar 30' shown in FIG. 4 is pressed by a press apparatus. Therefore, the electrode 30 including the head section 31 and the body section 32 is integrally formed through forging.

In one or more exemplary embodiments, cold forging may be used. Generally, hot forging is forging done over a recrystallization temperature of material, warm forging is forging done at the recrystallization temperature of material, and cold forging is forging below recrystallization temperature. Since there is no scale loss due to heating according to cold forging, loss of material is greatly reduced. In addition, since precise machining is possible, standard operation time is reduced and mass production is possible. Also, strength of the product is improved.

Therefore, if the electrode 30 for vapor deposition process according to an exemplary embodiment of the present invention is manufactured through cold forging, strength may be improved, manufacturing cost may be lowered, and mass production may be possible.

In addition, the pillar used for manufacturing the electrode 30 is made of oxygen-free copper (OFC), oxygen-Free high-conductivity copper (OFHC) or tough pitch copper.

Oxygen-free copper (OFC) is a copper from which oxygen is removed to be lower than or equal to about 0.008% by deoxidizer. If oxygen is contained in Cu, $H_2O$ is produced through reaction of $Cu_2O$ and hydrogen. Therefore, hydrogen embrittlement occurs and corrosion resistance is deteriorated. One of P, Si, Mg, Ca, U. Be, Ti, Zr, and combination thereof may be used as the deoxidiser, and an element thereof remains after manufacturing.

OFHC is a high purity copper that does not contain oxygen or deoxidiser. OFHC has high electric conductivity. After electrolytic copper is dissolved, the electrolytic copper is desulfurized by hydrogen gas. Sequentially, hydrogen gas is removed from the electrolytic copper by nitrogen gas or carbonate gas. Then. OFHC having 99.97% purity is obtained. OFHC made through vacuum dissolution method has 99.99% purity. Since typical oxygen-free copper (OFC) contains the deoxidizer such as phosphorus, silicon, lithium, and so on, OFC has a lower purity than OFHC.

Tough pitch copper is a copper made by melting and purifying electrolytic copper in a reverberatory furnace. Thereby, workability of tough pitch copper is enhanced. Since tough pitch copper contains a little oxygen (0.02-0.05%) and metal impurities exists therein in a form of oxides, distortion of crystal lattice in tough pitch copper is decreased and conductivity is excellent.

Therefore, if high purity oxygen-free copper (OFC). OFHC or tough pitch copper is used as the pillar for manufacturing the electrode 30 according to an exemplary embodiment of the present invention, electric conductivity may be improved.

Figure 5:
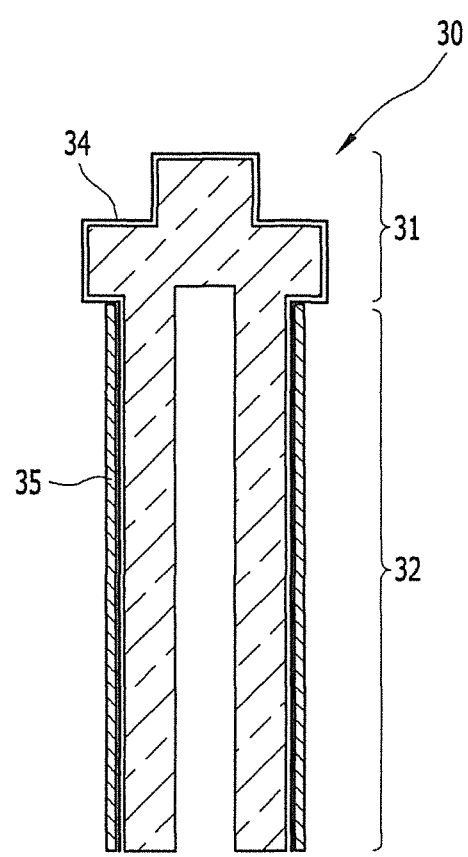
FIG. 5 is a cross-sectional view of an electrode for vapor deposition process according to another exemplary embodiment of the present invention.

A silver plating layer 34 may be formed at external circumferential surfaces of the head section 31 and the body section 32, as shown in FIG. 5. Electroplating or electroless plating by using silver mirror reaction is performed on a surface of the electrode 30 including the head section 31 and the body section 32. Silver is a conductor of heat and electricity and has good solderability and heat resistance. Therefore, cycle-life of the electrode 30 may be improved.

In addition, the body section 32, as shown in FIG. 5, may have an insulation layer 35 at an external circumferential surface of the silver plating layer 34. The body section 32 penetrates the lower surface of the reactor 10 and is exposed to the exterior of the reactor 10, as shown in FIG. 1. If leakage current occurs, accidents such as fire may occur. Therefore, the insulation layer 35 prevents current leakage. The insulation layer 35 is made of insulating materials through which current does not flow. In one or more exemplary embodiments, the insulation layer 35 may be made of insulating materials having strong heat resistance. In one or more exemplary embodiments, the insulation layer 35 may be formed by resin plating.

The head section 31 should apply current to the substrate 20 such as the silicon filament and is exposed to high temperature of about 1000° C. in the reactor 10. Therefore, the insulation layer 35 is not formed at the head section 31.

Figure 6:
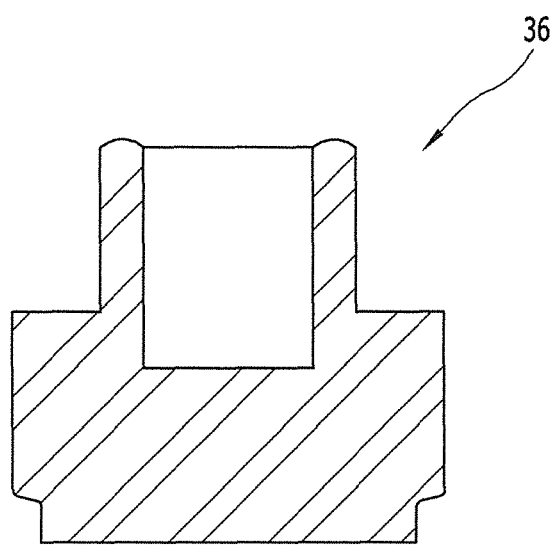
FIG. 6 is a cross-sectional view of a nut section of an electrode for vapor deposition process according to an exemplary embodiment of the present invention.

Meanwhile, the lower portion of the body section 32 is coupled to the nut section 36 shown in FIG. 6. The nut section 36 is coupled to the lower portion of the body section 32 so as to protect the lower portion of the electrode 30 and to improve connection to the external electric source 40. The nut section 36 like the head section 31 and the body section 32 is made of oxygen-free copper, oxygen-free high-conductivity copper (OFHC) or tough pitch copper.

Since the nut section 36 is formed through forging or cold forging, strength may be improved and manufacturing cost may be greatly lowered. In addition, the nut section 36 like the head section 31 or the body section 32 has the silver plating layer or the insulation layer.

The nut section 36 may be coupled to the body section 32 through welding. According to welding, solid materials are melted, mixed, and then cooled so as to be bonded with each other. One of the welding is fusion welding where members that will be coupled are contacted and a bonding portion is regionally heated, melted, and bonded.

Figure 8:
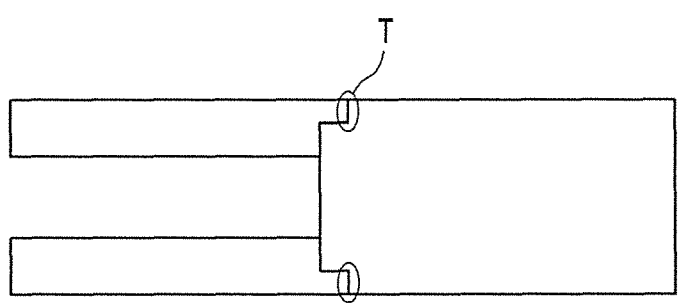
FIG. 8 is a schematic diagram for showing welding structure of a body section and a nut section according to an exemplary embodiment of the present invention.
Figure 8:
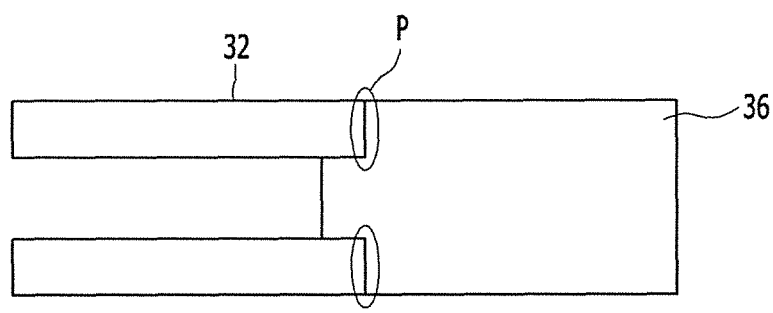

According to conventional arts shown in FIG. 8(*a*), an exterior circumferential portion of the body section is protruded, the nut section is inserted in the protruded portion T, and the body section and the nut section are coupled through high-frequency friction welding. In this case, electrical resistance of the electrode is high and electric conductivity is deteriorated. In addition, electric resistance further increases due to corrosion as times goes by.

Figure 9:
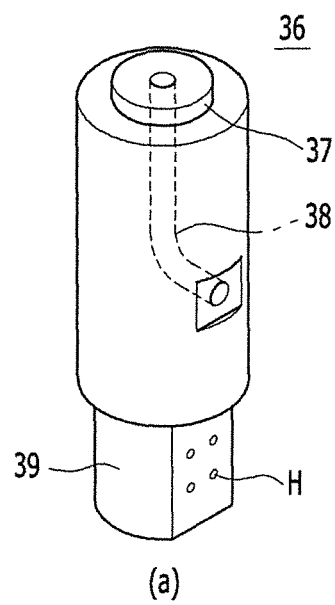
FIG. 9 is a schematic diagram of a nut section according to another exemplary embodiment of the present invention.
Figure 9:
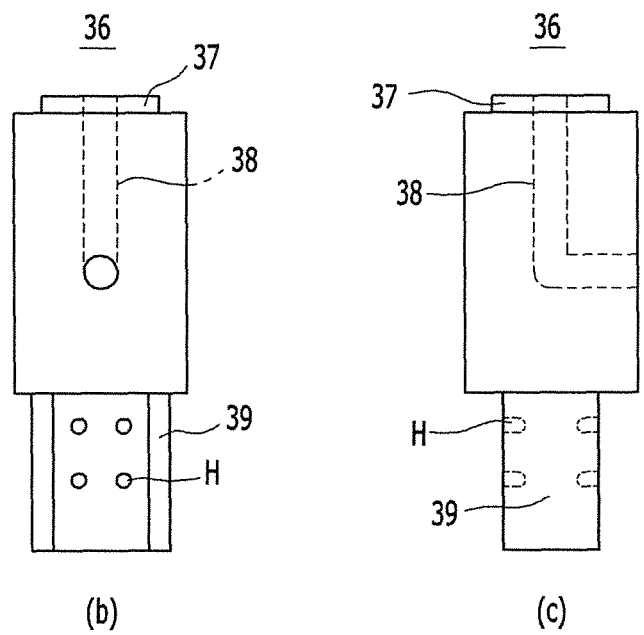

According to one or more exemplary embodiments of the present invention, a protruded section 37 of the nut section 36 is inserted in the coolant passage of the body section 32, and a lower annular circumferential portion P that is positioned radially outside of the coolant passage is coupled to the upper surface of the nut section 36 through fusion welding, as shown in FIG. 8(b) and FIG. 9. In this case, it is experimentally ascertained that electric resistance is lowered and electric conductivity is improved compared with conventional arts.

Meanwhile, a coolant supplying line 38 corresponding to the coolant passage 33 of the body section 32 may be formed at a side portion of the nut section 36, as shown in FIG. 9. Therefore, coolant supplied through the coolant supplying line 38 of the nut section 36 circulates in the electrode through the coolant passage 33 of the body section 32 connected thereto. The coolant supplying line 38 may be formed through machining that is not related to forging process of the nut section 36.

Figure 10:
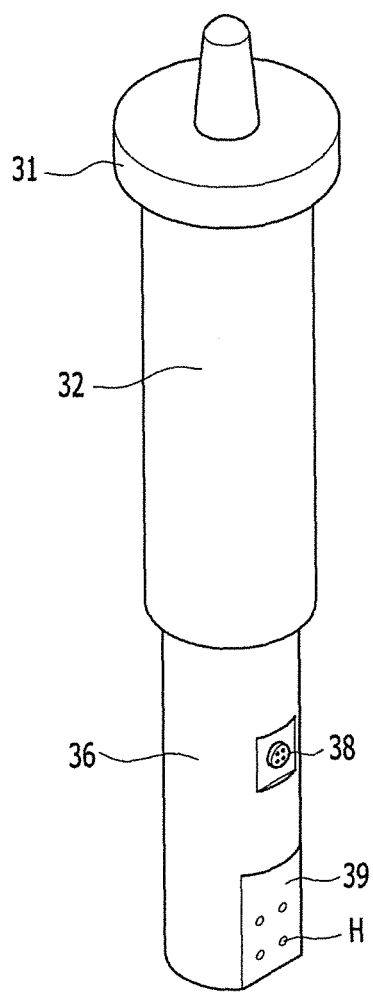
FIG. 10 is a perspective view of an electrode for vapor deposition process according to another exemplary embodiment of the present invention in which a body section and a nut section are coupled.

Meanwhile, an extended portion 39 is formed at a lower portion of the nut section 36 as shown in FIG. 9 to FIG. 10, and the external electric source 40 is connected to a side or both sides of the extended portion 39. The extended portion 39 may be integrally formed with the nut section 36 through forging.

According to conventional arts, the external electric source is connected to a lower surface of the nut section. Since the external electric source is connected through a narrow area, electric power may not be supplied stably and the external electric source may not be coupled strongly.

According to one or more exemplary embodiments of the present invention, the lower portion of the nut section 36 is extended so as to form the extended portion 39 and the external electric source 40 is coupled to the side of the extended portion 39. Since contact area becomes wide according to a length of the extended portion 39, electric power can be supplied stably. Particularly, if the both sides of the extended portion 39 are formed as flat surfaces and the external electric source 40 is coupled thereto, contacting area with the external electric source can be broadened in maximum and electric power can be stably supplied to the electrode through the both sides of the extended portion 39 as shown in FIG. 9 to FIG. 10.

In addition, at least one hole H is formed at the side or the both sides of the extended portion 39 such that the extended portion 39 and the external electric source 40 are coupled strongly by bolts. In one or more exemplary embodiments, four holes H are formed at the both sides of the extended portion 39 so as to be coupled with the external electric source strongly by the bolts, as shown in FIG. 9. The holes may be formed through forging or through separate hole-forming process.

A method of manufacturing an electrode for vapor deposition process according to an exemplary embodiment of the present invention will be described in detail.

Figure 7:
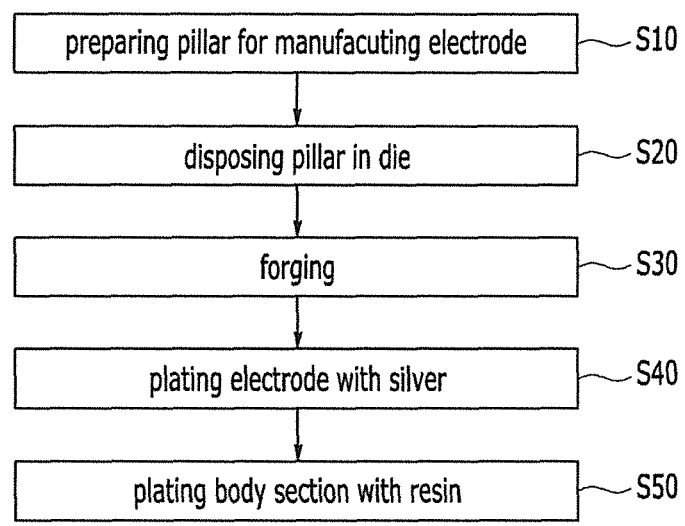
FIG. 7 is a flowchart of a method of manufacturing an electrode for vapor deposition process according to an exemplary embodiment of the present invention.

As shown in FIG. 7, the method according to an exemplary embodiment of the present invention includes preparing the pillar for manufacturing the electrode 30 at step S10, disposing the pillar in a die having a shape corresponding to that of the electrode 30 at step S20, and forming the head section 31 and the body section 32 of the electrode 30 by forging the pillar by means of the die at step S30.

Firstly, the pillar is prepared so as to manufacture the electrode 30 at the step S10. In one or more exemplary embodiments, the pillar is made of oxygen-free copper, oxygen-free high-conductivity copper (OFHC) or tough pitch copper having high purity and electric conductivity. As shown in FIG. 4, the pillar 30' has a circular cylindrical shape.

If the pillar is prepared, the pillar is disposed in the die at the step S20. The die has the shape corresponding to the head section 31 and the body section 32 of the electrode 30 shown in FIG. 2 and FIG. 3. Since the head section 31 has '⊥' shape, the die also has the shape corresponding to the shape of the head section 31. Since the body section 32 has the coolant passage 33 formed therein, the die may have a protruded portion corresponding to the coolant passage 33.

After that, the die is mounted at a press apparatus and the pillar is forged by the press apparatus such that the body section 32 and the head section 31 of the electrode 30 are integrally formed at the step S30. Since the head section 31 and the body section 32 of the electrode 30 are integrally forged, standard operation time is reduced and mass production is possible. In addition, use of material is small according to forging and production cost is lowered.

Meanwhile, the electrode 30 further includes the nut section 36 shown in FIG. 4 other than the head section 31 and the body section 32. In this case, a die having a shape corresponding to that of the nut section 36 is manufactured and the nut section 36 is formed through forging. Therefore, manufacturing cost is further lowered.

After that, in order to improve electric conductivity and heat resistance of the body section 32, the head section 31 or the nut section 36, the external circumferential surface of the body section 32, the head section 31 or the nut section 36 is plated at step S40. Electroplating or electroless plating by using silver mirror reaction may be performed.

In addition, the insulation layer 35 is formed by resin plating at the external circumferential surface of the body section 32 or the nut section 36 that is plated with silver at step S50. Since the body section 32 and the nut section 36 can be exposed to the exterior of the deposit reactor 10, the insulation layer 35 prevents fire due to leakage current.

A method of manufacturing an electrode for vapor deposition process according to another exemplary embodiment of the present invention will be described in detail.

Figure 11:
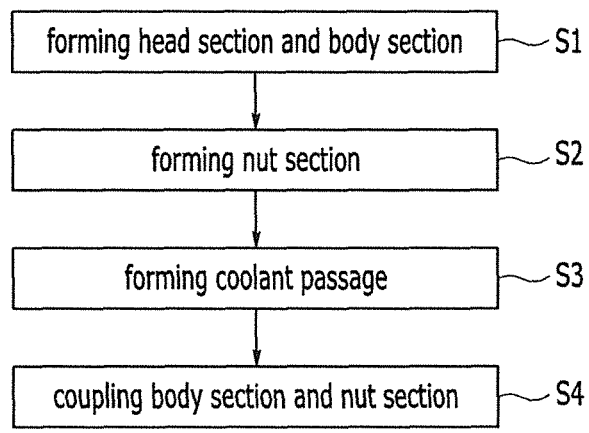
FIG. 11 is a flowchart of a method of manufacturing an electrode for vapor deposition process according to another exemplary embodiment of the present invention.

The method according to another exemplary embodiment of the present invention, as shown in FIG. 11, includes integrally forming the head section 31 coupled to the substrate and the body section 32 provided with the coolant passage through forging at step S1, forming the nut section 36 coupled to the lower portion of the body section 32 and connected to the external electric source through forging at step S2, forming a passage connected to the coolant passage at the nut section 36 at step S3, and coupling the body section 32 and the head section 31 through welding at step S4.

The step S1 where the head section 31 and the body section 32 are integrally formed through forging is performed by disposing the pillar in the die and forging the pillar so as to form the head section 31 and the body section 32, as described above.

The nut section 36 may be formed through forging a predetermined pillar at the step S2. At this time, the extended portion 39 is formed at the lower portion of the nut section 36 as shown in FIG. 9 to FIG. 10 such that the external electric source 40 is connected to the side or the both sides of the extended portion 39.

The coolant supplying line 38 corresponding to the coolant passage 33 of the body section 32 is formed at the side portion of the nut section 36 through an additional machining process at the step S3.

As shown in FIG. 8 and FIG. 10, the nut section 36 is coupled to the body section 32 through welding at the step S4.

As described above, since use of material and standard operation time are reduced through forging, manufacturing cost may be greatly lowered according to an exemplary embodiment of the present invention. Since crystals forming the electrode become dense by forging, electric conductivity and heat resistance may be improved.

In addition, since the coolant passage of the electrode is formed through forging, durability may be improved. Experimental results show that the electrode is broken according to conventional arts if pressure of the coolant is higher than a predetermined pressure, but the electrode formed by forging is not broken at a pressure higher than twice of the predetermined pressure.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing an electrode for vapor deposition process, comprising:
   preparing a pillar for manufacturing the electrode;
   disposing the pillar in a die having a shape corresponding to that of the electrode; and
   forming a head section and a cylindrical body section of the electrode by forging the pillar by means of the die,
   wherein the head section has an upper portion and a lower portion, wherein a diameter of the upper portion is smaller than that of the lower portion, and the lower portion of the head section has a larger diameter than the body section and wherein the diameter of the upper portion is smaller than that of the body section wherein the die is adapted to form a coolant passage by removing a part of a lower surface of the body section by a predetermined depth.

2. The method of claim 1, further comprising plating silver on external circumferential surfaces of the head section and the body section.

3. The method of claim 2, further comprising plating an insulation layer on an external circumferential surface of the body section plated by the silver.

4. The method of claim 1, wherein the pillar is made of oxygen-free copper, oxygen-free high-conductivity copper (OFHC), or tough pitch copper.

5. The method of claim 1, wherein the forming a head section further comprising:
   integrally forming a head section adapted to be coupled to a substrate and a body section provided with a coolant passage through forging; and
   forming a nut section coupled to a lower portion of the body section and electrically connected to an external electric source through forging.

6. The method of claim 5, further comprising:
   forming a coolant supplying line connected to the coolant passage and passing the coolant at the nut section; and
   coupling the body section with the nut section through welding.

7. The method of claim 5 or claim 6, wherein the nut section further comprises a connecting section extending downwardly from the nut section so as to be coupled with the external electric source, and the external electric source is coupled to one side or both sides of the connecting section.

8. A method of manufacturing an electrode for vapor deposition process, comprising:
   preparing a pillar for manufacturing the electrode;
   disposing the pillar in a die having a shape corresponding to that of the electrode; and
   forming a head section and a cylindrical body section of the electrode by forging the pillar by means of the die,
   wherein the head section has an upper portion and a lower portion, wherein a diameter of the upper portion is smaller than that of the lower portion, and the lower portion of the head section has a larger diameter than the body section and wherein the diameter of the upper portion is smaller than that of the body section; plating silver on external circumferential surfaces of the head section and the body section.

9. A method of manufacturing an electrode for vapor deposition process, comprising:
   preparing a pillar for manufacturing the electrode;
   disposing the pillar in a die having a shape corresponding to that of the electrode; and
   forming a head section and a cylindrical body section of the electrode by forging the pillar by means of the die,
   wherein the head section has an upper portion and a lower portion, wherein a diameter of the upper portion is smaller than that of the lower portion, and the lower portion of the head section has a larger diameter than the body section and wherein the diameter of the upper portion is smaller than that of the body section wherein the forming a head section further comprising integrally forming the head section adapted to be coupled to a substrate and a body section provided with a coolant passage through forging; and
   forming a nut section coupled to a lower portion of the body section and electrically connected to an external electric source through forging.

* * * * *